United States Patent [19]

Slack

[11] 4,323,327

[45] Apr. 6, 1982

[54] TEMPLATE ALIGNMENT DEVICE

[76] Inventor: Otto G. Slack, P.O. Box 20293, Portland, Oreg. 97220

[21] Appl. No.: 141,380

[22] Filed: Apr. 18, 1980

[51] Int. Cl.³ ............................................. B23P 17/00
[52] U.S. Cl. ...................................... 414/28; 29/760; 29/846; 269/903; 414/754; 414/787; 430/22
[58] Field of Search ....................... 414/28, 35, 36, 38, 414/97, 754, 786, 787; 29/760, 846; 271/785, 225, 226, 236; 33/180 R, 184.5; 264/903; 355/72; 430/22; 270/52

[56] References Cited

U.S. PATENT DOCUMENTS

| | | | |
|---|---|---|---|
| 1,883,499 | 10/1932 | Birtles | 156/313 X |
| 3,169,063 | 2/1965 | Johnston et al. | 430/22 |
| 3,671,125 | 6/1972 | Matveevich et al. | 355/133 |
| 4,189,820 | 2/1980 | Slack | 29/425 |
| 4,203,694 | 5/1980 | James | 414/28 |

FOREIGN PATENT DOCUMENTS 649976  9/1937  Fed. Rep. of Germany ........ 414/35

*Primary Examiner*—Leslie J. Paperner

*Attorney, Agent, or Firm*—Kolisch, Hartwell & Dickinson

[57] ABSTRACT

Method and apparatus for aligning a pair of planar templates on opposite sides of a planar board. The apparatus includes a pivotable open-book structure having a pair of surfaces which intersect at an inclined interior edge substantially paralleling the structure's pivot axis. Projecting from each of the surfaces, adjacent the lower edges thereof, is a pin for aligning matching edges in a board and template supported on the associated surface. When the structure is pivoted, an aligned board and template combination placed against one surface in the apparatus is flipped from that one to the other surface, exposing the other side of the board. The method of the invention proposes first, cradling a board and a template placed against one side of the board, with such cradling producing alignment of the two. The aligned board and template are flipped to expose the other side of the board. The aligned board and template and a second template placed against the other side of the board and then cradled to produce alignment between the board and the second template.

5 Claims, 5 Drawing Figures

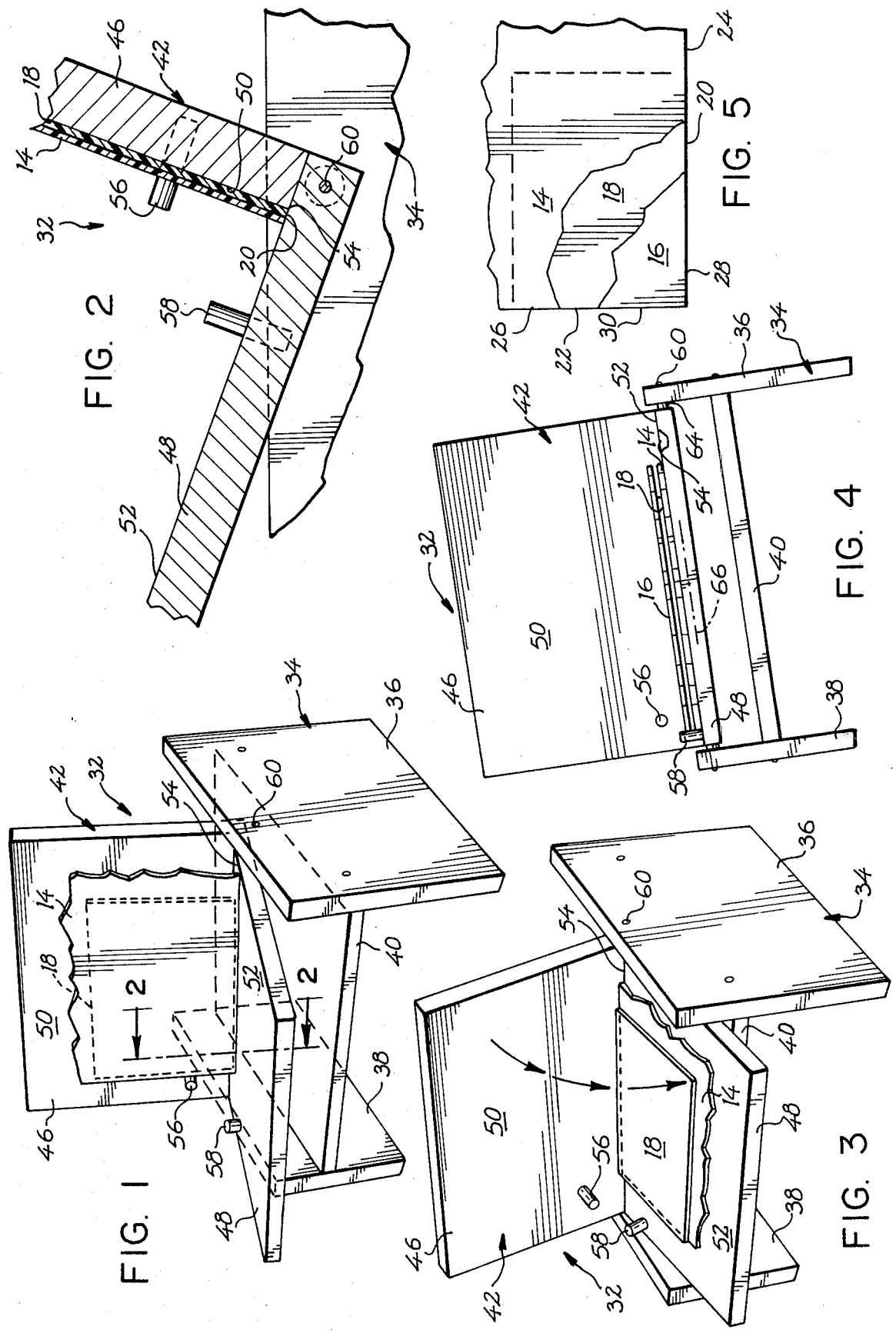

TEMPLATE ALIGNMENT DEVICE

BACKGROUND AND SUMMARY

The present invention relates to a method for aligning a pair of planar templates on opposite sides of a planar board, and apparatus for practicing this method.

Double-sided circuit boards having aligned circuit patterns on opposite board sides are commonly used in the electronics industry. In the usual case, such a board is formed by placing circuit pattern layouts at mutually aligned positions on opposite sides of the board. A photo-etching process is used to remove copper selectively from plating on the two board sides, so as to leave the desired circuit pattern on opposite sides of the board.

The present invention contemplates a method and apparatus for aligning a pair of templates on opposite sides of a board. The method of the present invention includes cradling a board and a template placed against one side thereof, with such cradling producing alignment in the template and the board. Where the templates and board have matching, intersecting edges, the template and board are supported, in their cradled position, at such edges. The aligned board and template are flipped to expose the board's other side. The second template is placed against the exposed side of the board, and the two templates and board are cradled, again to produce alignment between the board and the second-mentioned template.

The apparatus of the invention includes structure defining a pair of surfaces, each surface being adapted to promote alignment between a board and a template placed against one side of the board. The surfaces are mounted for shifting toward and away from a position wherein a board and template placed against one are flipped onto the other to expose the other side of the board.

A preferred embodiment of the invention includes an open-book structure having a pair of interior surfaces which intersect along an inclined edge having raised and lowered ends. The structure pivots about an axis substantially paralleling this edge. Projecting from each of the surfaces in the structure, adjacent the lower end of the inclined edge, is a pin which cooperates with the two surfaces to promote alignment of a board and template placed against one of the surfaces.

A general object of the present invention is to provide a simple, efficient method for aligning a pair of substantially planar templates on opposite sides of a planar board, and apparatus for practicing the method.

A more specific object of the invention is to provide such a method wherein alignment between a board and a template placed against one side of the board is produced by cradling the board and template.

These and other objects and features of the present invention will become more fully apparent when the following detailed description of the invention is read in conjunction with the accompanying drawings, wherein;

FIG. 1 is a perspective view of apparatus constructed according to the present invention, shown here during an initial stage of operation;

FIG. 2 is an enlarged, sectional view taken generally along line 2—2 in FIG. 1;

FIG. 3 is a view similar to FIG. 1, but showing the apparatus therein at an intermediate operating stage;

FIG. 4 is a front view showing the apparatus of FIGS. 1, 2 and 3 at a final operating stage; and FIG. 5 shows a pair of templates aligned on opposite sides of a board.

DETAILED DESCRIPTION OF THE INVENTION

The apparatus of the present invention is usable to align a pair of substantially planar templates on opposite sides of a substantially planar board. Such are illustrated, by way of example in FIG. 5, which shows a pair of planar templates 14, 16, aligned on opposite sides of a planar board 18. Board 18 has lower and side intersecting edges 20, 22 which are alignable with lower and side edges 24, 26, respectively, in template 14, and lower and side edges 28, 30, respectively, in template 16.

Typically, templates 14, 16 may take the form of photographic pattern layouts whose patterns are aligned when the two templates are planar-parallel and their lower and side edges are mutually aligned with matching lower and side edges of a board, such as board 18. A simple method for producing pattern alignment in templates, such as templates 14, 16, according to edge alignment with matching edges in a board, such as board 18, is detailed in my U.S. Pat. No. 4,189,820, for Template Pattern Alignment.

Turning now to FIGS. 1-4, apparatus constructed according to the present invention is indicated generally at 32. The apparatus includes a stand, or base 34 constructed of a pair of uprights 36, 38 secured to opposite end of a cross-member 40. As seen best in FIG. 4, base 34 is inclined for a reason which will become clear below.

An open-book structure 42 is mounted on the base for pivoting with respect thereto. Structure 42 is composed of a pair of plates, or leaves, 46, 48 whose interior surfaces 50, 52, respectively, are disposed at a right angle with respect to one another. These surfaces intersect along an inclined edge 54. As seen particularly in FIG. 2, structure 42 is constructed by securing the lower edge of leaf 46 in this figure to the upper surface of leaf 48, adjacent the latter's lower edge.

Mounted on each of leaves 46, 48, and projecting from the respective interior surfaces thereof, are pins 56, 58, respectively. Pin 58 is positioned somewhat closer to the left edge of structure 42 in FIGS. 1, 3 and 4, than is pin 56, for reasons which will be explained shortly. Pins 56, 58 are also referred to herein as means projecting from their respective surfaces.

Structure 42 is pivotally mounted on base 34 by a shaft 60 carried on structure 42 and extending parallel to edge 54. As seen best in FIG. 2, shaft 60 extends through leaf 48, along the lower right edge thereof. The opposed ends of the shaft extend beyond left and right edges of structure 42 in FIGS. 1, 3 and 4, and are rotatably received in suitable openings in uprights 36, 38. Structure 42 is centered between uprights 36, 38 by spacers, such as spacer 64 seen in FIG. 4. The axis of shaft 60, which is indicated in FIG. 4 by dash-dot line 66, is inclined for a purpose to be described. Base 34 and shaft 60 journaled thereon are also referred to herebelow as shiftable mounting means.

In its intended operation, structure 42 pivots between one position, like that shown in FIGS. 1 and 2 and another position like those shown in FIGS. 3 and 4. In its first position, surface 50 faces upwardly, i.e., to the right of a vertical plane passing through edge 54 in FIG.

2. In its second position, the surface faces downwardly, i.e., to the left of such a plane in FIG. 2.

The method of practicing the present invention using the apparatus described above will now be considered. With structure 42 placed in its first position, a circuit board, such as board 18, is placed against surface 50, with its lower edge 20 being supported on surface 52, as seen best in FIG. 2. The board is then moved toward the left in FIGS. 1, 3 and 4, either manually or under the influence of gravity, until its left side edge in these figures contacts pin 56. A template, such as template 14, is then placed against the outwardly facing surface of the board, with its lower and side edges in FIG. 1, 3 and 4 also supported by surface 52 and pin 56, respectively, as seen in FIG. 1. In the just-described configuration, the board and template are cradled by surfaces 50, 52 and pin 56, with such cradling aligning lower and side edges of the board and the template. The board and template are then releasably secured to one another in such relatively aligned positions by a conventional releasable adhesive material.

Structure 42 is then swung to move surface 50 toward downwardly facing position, wherein the aligned template and board supported on this surface are flipped onto surface 52 to expose the other side of the board. As seen with reference to FIG. 3, when the board and template are first flipped onto surface 52, their position along edge 54 is substantially that established by the position of pin 56 on surface 50. Following such a flipping operation, structure 42 is swung in the reverse direction to cause the board and template to seat snugly against edge 54. Subsequently, the aligned board and template are moved, either manually or under the influence of gravity, to place the left edges of the aligned board and template against pin 58. Thus it can be appreciated that the offset positions of pins 56, 58 ensure that the aligned template and board will be received uphill from pin 58 even if the template and board slide downhill slightly during flipping onto surface 52.

With template 14 and board 18 cradled by surfaces 52, 50 and pin 58, the second template 16 is placed on the exposed surface of board 18, with the lower (interior) and edges of the template being positioned against surface 50 and pin 58, respectively, to align the lower and side edges of the template with those of board 18. Thus, the final step in the practice of the present invention may be thought of as cradling aligned template 14 and board 18 and template 16 by surfaces 50, 52, and pin 58, with such cradling producing edge alignment between template 16 and board 18. Again, a releasable adhesive is used to attach template 16 releasably to board 18, with the two in aligned positions.

The aligned board and template are removed from apparatus 10, and subsequently handled in a conventional manner to produce, for example, aligned circuit patterns on opposite sides of board 18.

It will now be apparent how various objects ascribed to the method and apparatus of the present invention are met. By the method of the invention, a pair of templates may be aligned easily and quickly on opposed sides of a board. The apparatus of the invention is simple in construction and extremely easy to operate. Further, while the templates and board described for illustrative purposes herein have intersecting matching edges, it is understood that the templates and board may have any edge features which, when placed in the apparatus in the cradled positions described, will allow edge alignment between each template and the confronting board.

While a preferred embodiment of the method of the invention and apparatus for practicing same have been described, it is apparent that various modifications and changes may be made therein without departing from the spirit of the invention.

It is claimed and desired to secure by Letters Patent:

1. Apparatus for aligning a pair of substantially planar templates on opposite sides of a substantially planar board, said apparatus comprising means defining a first surface for receiving such a board, with one side of the board placed against said surface and with one of the templates placed against the other side of the board, means defining a second surface for receiving the combination of the board and the one template, with the one template placed against the one side of the board, and means shiftably mounting said first surface-defining means adjacent said second surface-defining means for shifting between a first position, where said first and second surface defining means are disposed to promote lower edge alignment between the board and the one and another templates, respectively, and a second position enabling flipping of the combination of the one template and the board from said first surface onto said second surface.

2. The apparatus of claim 1, wherein said first and second surfaces occupy relatively fixed planes which intersect at an interior edge.

3. The apparatus of claim 2, wherein said mounting means includes means defining a pivot axis to enable such shifting, with said axis substantially paralleling said edge.

4. Apparatus for aligning a pair of substantially planar templates on opposite sides of a substantially planar board, said apparatus comprising means defining a first surface for receiving such a board, with one side of the board placed against said surface and with one of the templates placed against the other side of the board, said first surface promoting alignment between the one template and the board on the latter's other side, means defining a second surface for receiving the combination of the board and the one template, with the one template placed against said second surface and with the other template placed against the one side of the board, said second surface promoting alignment between the other template and the board, on the latter's one side, said first and second surfaces occupying relatively fixed planes which intersect at an interior edge having raised and lowered ends, for each of said surfaces, means projecting therefrom for engaging an edge in a template and a board, each of said projecting means being located relatively closer to said lowered end than to said raised end, and means shiftably mounting said first surface-defining means adjacent said second surface-defining means for shifting toward and away from a position enabling flipping of the combination of the one template and a board from said first surface onto said second surface.

5. The apparatus of claim 4, wherein the projecting means associated with said second surface is closer to said lower end than the projecting means associated with said first surface.

* * * * *